United States Patent
Boerzsoenyi et al.

(10) Patent No.: US 11,899,441 B2
(45) Date of Patent: Feb. 13, 2024

(54) REMAINING SERVICE LIFE PREDICTION FOR SWITCHES

(71) Applicant: Siemens Aktiengesellschaft, Munich (DE)

(72) Inventors: Christoph Boerzsoenyi, Nuremberg (DE); Wolfgang Erven, Amberg (DE); Alexander Fanderl, Regensburg (DE); Thomas Moosburger, Regensburg (DE); Juergen Reisinger, Schmidgaden (DE); Bernd Schwinn, Fuerth (DE); Matthias Strobl, Bayern (DE); Stefan Widmann, OT Lintach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/283,350

(22) PCT Filed: Sep. 24, 2019

(86) PCT No.: PCT/EP2019/075730
§ 371 (c)(1),
(2) Date: Apr. 7, 2021

(87) PCT Pub. No.: WO2020/074253
PCT Pub. Date: Apr. 16, 2020

(65) Prior Publication Data
US 2022/0004181 A1 Jan. 6, 2022

(30) Foreign Application Priority Data
Oct. 10, 2018 (DE) ............. 10 2018 217 336.2

(51) Int. Cl.
G05B 23/02 (2006.01)
G01R 31/327 (2006.01)

(52) U.S. Cl.
CPC ....... G05B 23/0283 (2013.01); G01R 31/327 (2013.01)

(58) Field of Classification Search
CPC ............. G01R 31/327; G06Q 10/0635; G05B 23/0283
See application file for complete search history.

(56) References Cited

U.S. PATENT DOCUMENTS 9,322,762 B2 4/2016 Cercueil et al.
2003/0030448 A1* 2/2003 Sapir ................. H02H 1/04
324/536

(Continued)

FOREIGN PATENT DOCUMENTS

CN 103156685 A 6/2013
CN 103344511 A 10/2013

(Continued)

OTHER PUBLICATIONS

Machine translation of EP1318533A1 (Year: 2003).*

(Continued)

Primary Examiner — Eman A Alkafawi
Assistant Examiner — Sangkyung Lee
(74) Attorney, Agent, or Firm — Harness, Dickey & Pierce, P.L.C.

(57) ABSTRACT

Events relevant for the service life are recorded for calculating the remaining service life of a switch. Events relevant for the service life are evaluated with respect to the frequency of their occurrence. The possibility of a future occurrence for the service life of relevant events is taken into account or not taken into account in accordance with the frequency of their occurrence for calculating the remaining service life.

10 Claims, 4 Drawing Sheets

(56) References Cited

U.S. PATENT DOCUMENTS

Figure 1:
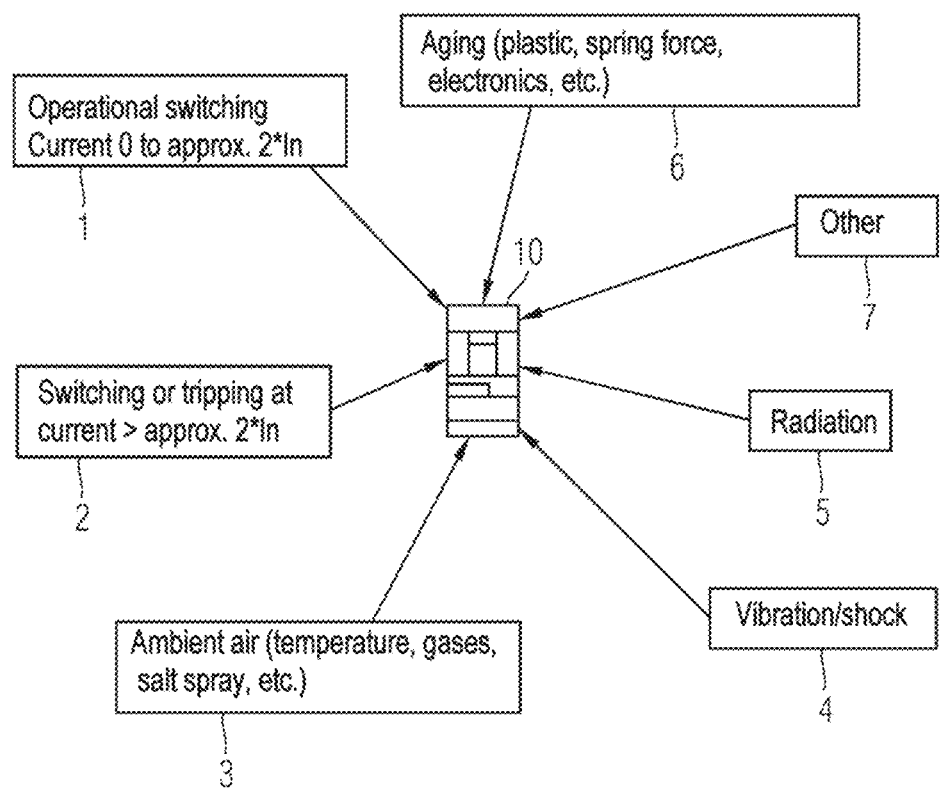

| | | | | |
|---|---|---|---|---|
| 2003/0185271 | A1* | 10/2003 | Isozumi | G01K 3/04 |
| | | | | 374/45 |
| 2007/0112471 | A1* | 5/2007 | Erkens | H02J 3/008 |
| | | | | 700/291 |
| 2011/0173432 | A1* | 7/2011 | Cher | G01R 31/31725 |
| | | | | 702/186 |
| 2012/0283963 | A1 | 11/2012 | Mitchell et al. | |
| 2013/0151182 | A1 | 6/2013 | Glindemann | |
| 2013/0231872 | A1* | 9/2013 | Cercueil | G01N 17/00 |
| | | | | 702/34 |
| 2014/0365271 | A1 | 12/2014 | Smiley et al. | |
| 2017/0076891 | A1* | 3/2017 | Dold | H01H 47/002 |
| 2017/0236676 | A1* | 8/2017 | Bartonek | H02J 13/00036 |
| | | | | 361/115 |
| 2019/0310621 | A1 | 10/2019 | Magoni et al. | |

FOREIGN PATENT DOCUMENTS

| | | |
|---|---|---|
| CN | 103649470 A | 3/2014 |
| CN | 104102804 A | 10/2014 |
| CN | 105740546 A | 7/2016 |
| CN | 106528951 A | 3/2017 |
| DE | 102012105198 A1 | 12/2013 |
| EP | 1318533 A1 * | 6/2003 ........... H01H 1/0015 |
| EP | 3258332 A1 | 12/2017 |
| KR | 20140086269 A | 7/2014 |

OTHER PUBLICATIONS

Knostmann Tobias: "Digitaler Zwilling—Simulation im Betrieb". In: CADFEM GmbH. Marktplatz 2, 85567 Grafing bei München: CADFEM. Aug. 25, 2017.—Firmenschrift. https://www.cadfem.de/fileadmin/PDFs/Aktuelles/Veranstaltungen/Digitaler-Zwilling/Digitaler-Zwilling-Relais.pdf [abgerufen am Sep. 20, 2019]: 2017.

PCT International Search Report and Written Opinion of International Searching Authority dated Mar. 10, 2020 corresponding to PCT International Application No. PCT/EP2019/075730 filed Sep. 24, 2019.

German Office Action dated Sep. 24, 2019.

* cited by examiner

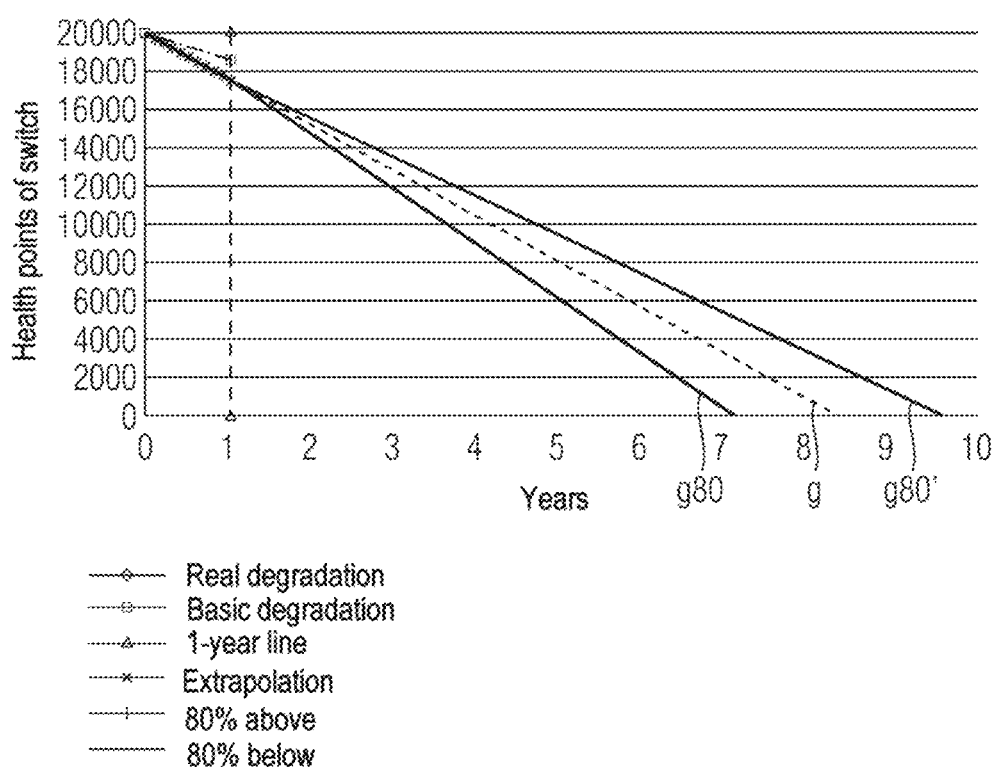

REMAINING SERVICE LIFE PREDICTION FOR SWITCHES

PRIORITY STATEMENT

This application is the national phase under 35 U.S.C. § 371 of PCT International Application No. PCT/EP2019/075730 which has an International filing date of Sep. 24, 2019, which designated the United States of America and which claims priority to German application DE 102018217336.2 filed Oct. 10, 2018, the entire contents of each of which are hereby incorporated herein by reference.

FIELD

Embodiments of the disclosure generally relate to a method and a device for calculating a remaining lifetime of a switch and to a storage medium, on which a computer program for carrying out the method is stored.

BACKGROUND

Switches are a central component of energy distribution networks for all voltage ranges. In particular, circuit breakers (for example molded case circuit breakers, air circuit breakers) are used on different distribution levels in power distribution (main distribution, subdistribution).

With each switching process (switch-on and switch-off, for example without load, with a low load, with a nominal current, when switching with undervoltage releases/shunt releases, with overload tripping and short-circuit tripping) the contact material of a switch changes in terms of thickness and shape (the surface of the alloy from which the contacts are typically produced also partly changes due to melting). This change is generally accompanied by wear of the switch. Moreover, there are many other influencing factors such as material aging, vibration and shock events, quality of the ambient air, ambient temperature, operating time, and operating current, etc., which limit the lifetime of a circuit breaker.

After an initially unknown period, the circuit breaker therefore has to undergo maintenance or even has to be exchanged. However, it is necessary to disconnect the system for this purpose. Disconnection and hence failure of a system of a network that is not predictable or calculable impairs the operation of the network. It is desirable for the system or network operator to estimate the time of the failure or exchange in order to be able to take measures that reduce the impairment of the network operation.

U.S. Pat. No. 9,322,762 B2 specifies a method for identifying the remaining lifetime of an electrical device. The document states that the information with respect to the remaining lifetime should be interpreted with caution (column 4, lines 17-21):

". . . the remaining lifetime is a forecast on the state of the device or of the equipment unit, the operating conditions considered to be constant. The remaining lifetime should therefore not be interpreted as a failure date."

SUMMARY

The inventors have discovered that, considering this difficulty, the users or maintenance personnel should be provided with a piece of information as a remaining lifetime estimation that is as intuitive and easy as possible to interpret.

At least one embodiment of the invention is directed to an improved remaining lifetime prediction for switches.

Embodiments are directed to a method, a device and a storage medium. Advantageous developments are specified in the claims.

In the following text, the expression "remaining lifetime" does not necessarily relate to a period of time but generally signifies a piece of information about the future operability. This piece of information may even be, for example, a failure time or another measure as a time interval for the operation until failure. Another measure as a time interval is, for example in a circuit breaker, the number of switching cycles during operational switching.

At least one embodiment of the invention proposes a method for calculating a forecast value for the remaining lifetime of a switch. In this case, the switch is preferably a switch for a low-voltage system. For the sake of simplicity, the following text speaks of the calculation of a remaining lifetime for short, instead of the calculation of a forecast value for the remaining lifetime. According to an embodiment of the invention, events relevant to the lifetime (for example switching below and above 2 * In (In=rated current of the switch)) are detected. The events relevant to the lifetime are evaluated with respect to the frequency of the occurrence thereof. In the remaining lifetime calculation, the possibility of a future occurrence of events relevant to the lifetime is then taken into account or is not taken into account for the calculation of the remaining lifetime according to the frequency of the occurrence thereof.

The subject matter of at least one embodiment of the invention also comprises a switch, a device, and a storage medium, which are designed, for example, to carry out a method according to at least one embodiment of the invention. In this case, the method according to at least one embodiment of the invention can be executed both locally and externally. In particular, it is possible to carry out the method in a central installation (for example a control room) to which switch data are transmitted for this purpose. In the latter case, the storage medium according to at least one embodiment of the invention would be part of the central installation.

BRIEF DESCRIPTION OF THE ACCOMPANYING DRAWINGS

Figure 2:
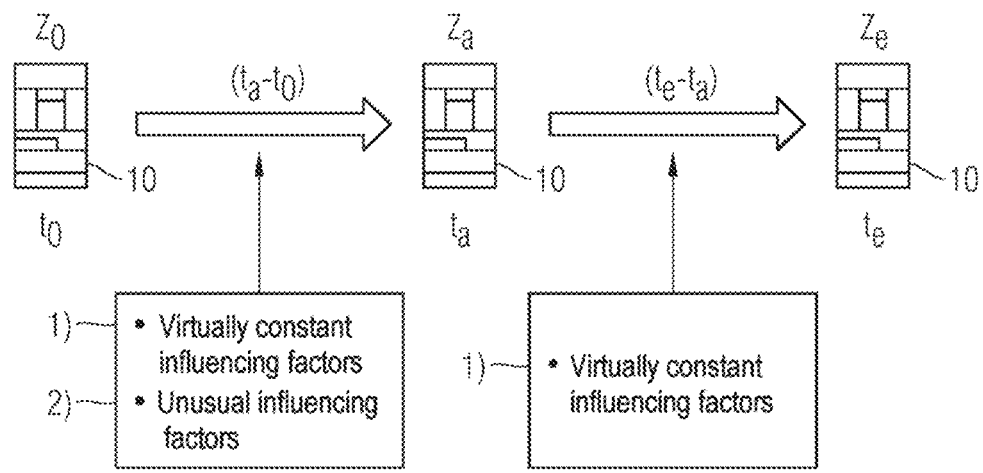
Figure 3:
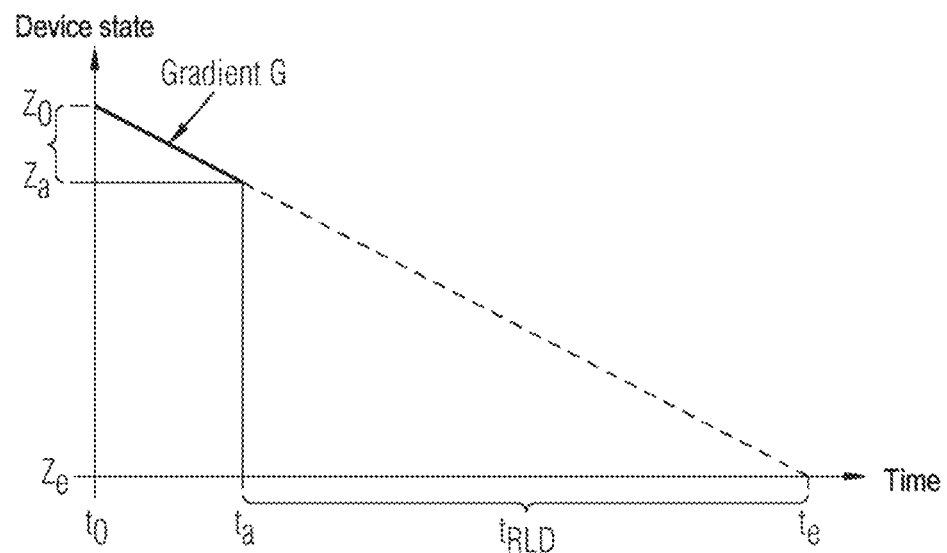
Figure 4:
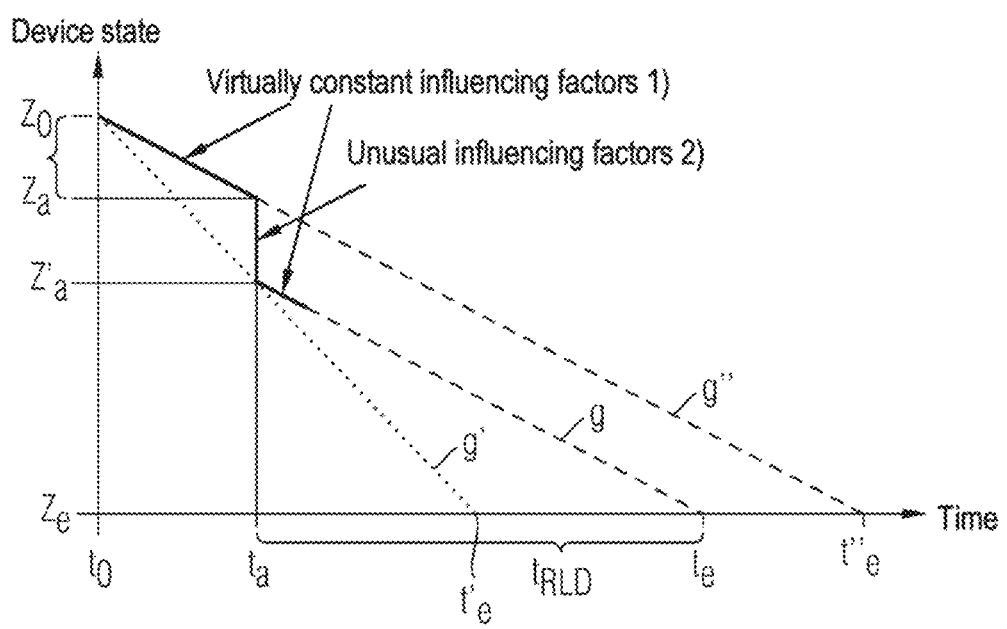

The invention is described in more detail in the following text within the context of an example embodiment with reference to figures, in which:

FIG. 1: shows influencing factors on the aging of a switch,

FIG. 2: shows a basic depiction of the concept according to an embodiment of the invention for the improved prediction of the remaining lifetime, FIG. 3: shows a basic depiction of a remaining lifetime estimation, FIG. 4: shows a basic depiction of a remaining lifetime estimation improved according to the concept according to an embodiment of the invention, and FIG. 5: shows a remaining lifetime estimation with sigma field.

DETAILED DESCRIPTION OF THE EXAMPLE EMBODIMENTS

At least one embodiment of the invention proposes a method for calculating a forecast value for the remaining lifetime of a switch. In this case, the switch is preferably a switch for a low-voltage system. For the sake of simplicity, the following text speaks of the calculation of a remaining lifetime for short, instead of the calculation of a forecast value for the remaining lifetime. According to an embodiment of the invention, events relevant to the lifetime (for example switching below and above 2 * In (In=rated current of the switch)) are detected. The events relevant to the lifetime are evaluated with respect to the frequency of the occurrence thereof. In the remaining lifetime calculation, the possibility of a future occurrence of events relevant to the lifetime is then taken into account or is not taken into account for the calculation of the remaining lifetime according to the frequency of the occurrence thereof.

Taking into account a possible occurrence of rare events, which often also have a significant effect on the lifetime (for example short circuits or a temporary overload that leads to an increased temperature and hence to more rapid aging of materials, such as plastic, for example), for the remaining lifetime calculation can lead to a scattering of the prediction values in the case of various switches, which makes it more difficult for the operating personnel to classify them. An improved comparability of remaining lifetime prediction values is achieved by virtue of only events that occur at a specific frequency (for example operational switching) being used for the remaining lifetime prediction. In addition, external influencing factors such as temperature, humidity etc., which likewise do not lead to a greater scattering of the prediction results that is difficult for the operating personnel to classify, can of course also be taken into account for the remaining lifetime prediction.

According to one configuration, a criterion for a rare occurrence of events relevant to the lifetime is determined. Events relevant to the lifetime that are detected in the past are then (possibly precisely then) not taken into account if they satisfy the criterion. There are many options for determining such a criterion, for example the number of events in the past operating life of the switch, possibly weighted with the present operational life, or a relative standard deviation calculated for events. According to one configuration, events relevant to the lifetime are assigned event types (for example operational switching, protective releases, mechanical vibrations, etc.). Future events can then be taken into account or not taken into account for the calculation of the remaining lifetime according to the frequency of the occurrence of events of the assigned event type.

According to one development of the subject of the invention, a quantitative measure for the current state of aging—referred to as "state of aging" in the following text for the sake of simplicity—is determined. This is carried out, for example, by means of calculation, modeling, measurement (for example degradation of contact material) or a combination of these methods. The remaining lifetime is then calculated based on the current state of aging. According to one configuration, events relevant to the lifetime that are detected in the past are taken into account for the calculation of the current state of aging irrespective of the frequency of the occurrence thereof. That is to say that both frequent or regular as well as rare or unusual events that are relevant to the lifetime are then taken into account for the calculation of the current state of aging.

The switch may be a circuit breaker for energy distribution designed for
  a) a first switching process, which can generally be assigned to regular operation, and
  b) a second switching process, which can generally be assigned to a protective function.

In such switches, it is useful to detect switching cycles according to the first and second switching process as events relevant to the lifetime and to take a future occurrence of switching cycles according to the first switching process into account in the calculation of the future operational lifetime or remaining lifetime and to not take possible future switching cycles according to the second switching process into account in the calculation of the future operational lifetime or remaining lifetime. In contrast, when a current state of aging is determined, switching cycles according to the first and second switching process should be taken into account in the determination of the current state of aging. In this case, a current measured in a switching event can be used as a basis for determining whether it is a first switching process or a second switching process.

The subject matter of at least one embodiment of the invention also comprises a switch, a device, and a storage medium, which are designed, for example, to carry out a method according to at least one embodiment of the invention. In this case, the method according to at least one embodiment of the invention can be executed both locally and externally. In particular, it is possible to carry out the method in a central installation (for example a control room) to which switch data are transmitted for this purpose. In the latter case, the storage medium according to at least one embodiment of the invention would be part of the central installation.

FIG. 1 shows factors in the aging of a switch 10.
The following are shown (In=rated current of the switch):
1) operational switching (current 0 to approx. 2 * In)
2) switching or tripping given a current >approx. 2*In ("2*In" is determined here as the limit threshold from which a significant degree of wear occurs. This limit threshold also depends on the switch type and would be fixed accordingly at a suitable value, possibly different from 2*In, for the respective switch type)
3) ambient air (temperature, gases, salt spray, etc.)
4) vibration or shock events
5) radiation
6) aging (material-induced, relating, for example, to plastic, spring force, electronics, etc.)
7) other These factors sometimes differ very significantly with respect to the occurrence thereof.

For example, it should be taken into account that a circuit breaker typically has several tasks in energy distribution:
a) It protects, inter alia, the subordinate energy distribution from overcurrent and short circuit (no. 2) in the list above and in FIG. 1).
b) It can also be used as a switch by closing and opening the main contacts (no. 1) in the list above and in FIG. 1).

The main contacts have been developed from one material in order to make possible both operational switching and protective shutdowns. The influence on the aging (deterioration) greatly depends on the type of switching. Operational switching of nominal currents is a continuous event with a low degree of change. In contrast, rare protective shutdowns such as in the case of a short circuit lead to a deterioration effect that is greater by orders of magnitude.

The same applies to other factors that influence aging. For example, material aging is a continuous process. In contrast, mechanical vibration during transport of the switch or earthquakes is a very rare event.

A central idea of the present application is to differentiate between two categories of influencing factors:
  1) virtually constant or continuous influencing factors
  2) unusual influencing factors Unusual influencing factors typically take the form of rare events. In this case, the events are so rare that a statement about the statistical frequency of the occurrence thereof over the remaining lifetime is not useful.

A criterion for the rare occurrence can be specified mathematically, for example in the form of a threshold value for the standard deviation. Alternatively, types of influencing factor can be graded as unusual on the basis of empirical values, for example tripping due to short circuit, mechanical vibrations etc. Another possible criterion is, for example, a low expected value for the number of events over the entire lifetime, for example an expected value <10.

A specific example of the division into virtually constant and unusual influencing factors are the two types of switching mentioned above: operational switching and short-circuit switching. Operational switching is carried out regularly (that is to say it is a virtually constant influencing factor), while short-circuit tripping hardly happens (unusual influencing factor). These two types of switching can be distinguished, for example, through current measurements (for example switching below and above 2 * In).

Despite their rare occurrence, the unusual influencing factors are mostly significant for the actual state due to the strong effect on aging. However, it is not possible to make a reliable statement about the occurrence thereof over the remaining lifetime.

It is therefore proposed not to take the unusual factors into account in the calculation of the remaining lifetime but instead in the consideration of the determination of the actual state. This is shown schematically in FIG. 2.

A switch 10 is activated at the time t0. The state of the switch corresponds at the time t0 to the new state Z0. The switch is inspected at the time ta. The state Za at the time ta has deteriorated in the period (ta-t0) due to aging over operation. Both virtually constant influencing factors 1) and unusual influencing factors 2) are to be taken into account in the determination of the deterioration or aging at the time ta.

The state Za can be determined in principle by the following two methods, which can also be combined with one another:

a) The influencing factors 1) and 2) are detected as completely as possible over the previous operation in the time interval (ta-t0). This includes, for example, counters, which are incremented according to the number of operational and short-circuit-induced switching processes.

b) The state Za is measured at the time ta. For example, the material degradation at the switching contacts can be determined by measuring contact heights or the overtravel.

In contrast, only virtually constant influencing factors of type 1) are used for the estimation of the remaining lifetime (te-ta) or the estimation of the lifetime end te (achievement of state Ze in which there should be no more operation of the switch). In other words, the remaining lifetime is estimated assuming that no unusual influencing factors occur.

As a result of the fact that no events which have no useful statistical basis for their prediction are used for the remaining lifetime prediction, the remaining lifetime estimation results become more consistent and more comparable. A value that is more intuitive and easier to interpret is therefore provided than if the value were to contain statistically useless components. The operating personnel can therefore better compare between statements for various switches and develop an intuition for the interpretation of the values for the remaining lifetime.

In the following text, a procedure in the prediction of the remaining lifetime is explained and the concept according to an embodiment of the invention is illustrated using this example.

The remaining lifetime tRLD can be calculated or estimated (FIG. 3) by forming a negative gradient G with the aid of the device state at the time of manufacture Z0, the current device state Za, the age of the switch ta and the knowledge of the state Ze in which proper operation is no longer ensured (cf. FIG. 2).

According to an embodiment of the invention, there is a differentiation between "virtually constant influencing factors" such as operational switching or/and aging and unusual influencing factors (for example short-circuit tripping). Only the changes in the device state as a result of "virtually constant influencing factors" have to be provided to calculate the gradient G for the observation.

Due to events based on unusual influencing factors, although the device state changes to a great extent temporarily, the consideration thereof for calculating the gradient would lead to a misleading significantly shortened remaining lifetime.

This is illustrated schematically in FIG. 4.

In FIG. 4, it is assumed that a short circuit (event based on an unusual influencing factor) occurs at the time ta. Due to the short circuit, the device state significantly deteriorates practically instantaneously, namely from the state Za to the state Za'. A failure time te' would be obtained (line g') when taking into account this deterioration due to the short circuit in the gradient formation. This result obscures the actual situation, namely that a short circuit has significantly influenced the device state. The statement with respect to the failure time te' is misleading in so far as the event of a short circuit is too rare to make a reliable quantitative statement about the probability that a further short circuit occurs during the remaining lifetime.

Therefore, although the short circuit is used according to an embodiment of the invention for determining the actual state Za', it is not used to calculate the gradient. The straight line g that leads to the failure time te is thus representative. This is a more meaningful value than te', not only because it provides a comparability with remaining lifetime estimation values of other switches but because the difference of the prediction value te' before the occurrence of the short circuit and the value te' constitutes a measure for how much lifetime the short circuit cost. That is to say that the difference value is a measure for the influence of the unusual event "short circuit" on the lifetime. The shortening of the predicted remaining lifetime corresponds to the effect of the short circuit that happened in the past.

FIG. 3 and FIG. 4 show a very simplified procedure in the remaining lifetime calculation. In reality, a plurality of factors will be taken into account (such as described in FIG. 1 and for example also in U.S. Pat. No. 9,322,762 B2). Refinements of the method are possible. For example, different gradients can be formed over several periods and these can be weighted in reverse chronological order. The most up-to-date events are therefore taken into account to a greater extent than events that happened long in the past.

The remaining lifetime can be determined both in the device but also outside of the device. For example, the switch can be equipped with a transmission function in order to transmit data for a lifetime calculation to a central control point. There, it may be possible for the lifetime calculation to be performed for a plurality of switches. Such a control center can then, for example, also be provided with optimization software for maintenance functions, for example combining maintenance areas with a plurality of switches and determining maintenance appointments for each maintenance area.

Sensors for detecting or determining the device state and/or external parameters relevant to the lifetime (temperature, moisture, etc.) can be arranged both inside the switch or the switch gear containing the switch or externally.

A significant improvement in the prediction can be achieved when each individual influencing factor receives its own gradient and, in each case, the shortest of the individual remaining lifetimes is specified as the overall remaining lifetime of the device in the consideration of the remaining lifetime.

According to one configuration, a minimum remaining lifetime can be specified with a defined probability up to a specific date. The customer can also be given a time window in which the switch reaches its lifetime end with a defined probability (sigma range), see FIG. 5, where, in addition to the line g for the remaining lifetime prediction, lines g80 and g80' are plotted, which define a region around the line g that corresponds to a probability of 80%.

The invention claimed is:

1. A method for calculating a remaining lifetime of a switch, comprising:
   providing a switch, including a circuit breaker, that performs a first switching process, generally assignable to regular operation, and a second switching process, generally assignable to a protective function, comprising short circuit switching;
   turning on the first switching process;
   detecting, switching events relevant to the lifetime of the switch, where switching events of the second switching process are detected via at least one sensor of the switch;
   evaluating, via a processor, the switching events detected, relevant to the lifetime of the switch, with respect to a frequency of an occurrence of the switching events;
   detecting switching events, according to the first switching process and the second switching process, as switching events relevant to the lifetime of the switch;
   turning on the second switching process that is for the protective function upon receipt of a command from the at least one sensor of a short circuit;
   determining, via the processor, a current state of aging of the switch, wherein previously detected switching events relevant to the lifetime of the switch are taken into account for calculating the current state of aging of the switch, irrespective of the frequency of the occurrence of the switching events, and wherein switching events according to the first switching process and second switching process are taken into account in the determining of the current state of aging of the switch;
   calculating the remaining lifetime of the switch based on the determined current state of aging of the switch, wherein future switching events according to the first switching process are taken into account, and future switching events according to the second switching process are not taken into account, in the calculating of the remaining lifetime of the switch; and
   providing the calculated remaining lifetime information to users or maintenance personnel.

2. The method of claim 1, further comprising:
   determining a criterion for a rare occurrence of switching events relevant to the lifetime of the switch; and
   not taking the switching events relevant to the lifetime of the switch, detected previously, into account upon the switching events satisfying the criterion determined.

3. The method of claim 2, further comprising:
   assigning switching events, relevant to the lifetime of the switch, event types, wherein the calculating of the remaining lifetime of the switch, taking or not taking future events into account, takes place based upon a frequency of occurrence of events of an event type assigned.

4. The method of claim 1, further comprising:
   using a current measured in a switching event, as a basis for determining whether the switching event is a first switching process or a second switching process.

5. A device for calculating a remaining lifetime of a switch including a circuit breaker that performs a first switching process generally assignable to regular operation and a second switching process generally assignable to a protective function, comprising a short circuit switching, comprising:
   at least one processor connected to the switch and configured to
      receive detected switching events relevant to the lifetime of the switch from at least one sensor of the switch, where switching events of the second switching process are detected via at least one sensor of the switch;
      evaluate the switching events detected, relevant to the lifetime of the switch, with respect to a frequency of an occurrence of the switching events;
      detect switching events of the switch, according to the first switching process, the first switching process having been turned on, and the second switching process, the second switching process having been turned on, as switching events relevant to the lifetime of the switch;
      determine a current state of aging of the switch, wherein previously detected switching events relevant to the lifetime of the switch are taken into account for calculating of the current state of aging of the switch, irrespective of the frequency of the occurrence of the switching events;
      determine a current state of aging of the switch, wherein switching events according to the first switching process and second switching process are taken into account in the determining of the current state of aging of the switch;
      calculate the remaining lifetime of the switch based on the determined current state of aging of the switch, wherein future switching events according to the first switching process are taken into account, and future switching events according to the second switching process are not taken into account, in the calculating of the remaining lifetime of the switch; and
      provide the calculated remaining lifetime information to users or maintenance personnel.

6. The device of claim 5, wherein the device is part of the switch.

7. The device of claim 3, wherein the device is realized at least partly outside of the switch.

8. A non-transitory storage medium, storing a computer program for carrying out the method of claim 1 upon execution by at least one processor.

9. The method of claim 1, further comprising:
   assigning switching events, relevant to the lifetime of the switch, event types, wherein the calculating of the remaining lifetime of the switch, taking or not taking future switching events into account, takes place based upon a frequency of occurrence of switching events of an event type assigned.

10. The method of claim 1, further comprising transmitting the detected events from the switch to a control point prior to calculating the remaining lifetime of the switch.

\* \* \* \* \*